| United States Patent [19] | [11] Patent Number: 4,715,900 |
|---|---|
| Connon et al. | [45] Date of Patent: Dec. 29, 1987 |

[54] AZEOTROPIC COMPOSITIONS OF TRICHLOROTRIFLUOROETHANE, DICHLORODIFLUOROETHANE AND METHANOL/ETHANOL

[75] Inventors: Helen A. Connon, Wilmington; Robert A. Gorski, Newark; William G. Kenyon, Wilmington; Akimichi Yokozeki, Greenville, all of Del.

[73] Assignee: E. I. Du Pont de Nemours and Company, Wilmington, Del.

[21] Appl. No.: 1,454

[22] Filed: Jan. 8, 1987

[51] Int. Cl.[4] .............................. B08B 3/08; C11D 7/50
[52] U.S. Cl. ...................................... 134/31; 134/40; 134/42; 252/171; 252/364; 252/DIG. 9
[58] Field of Search ................. 252/171, 364, DIG. 9; 134/31, 40, 42

[56] References Cited

U.S. PATENT DOCUMENTS

| 2,999,815 | 9/1961 | Eiseman | 252/171 |
|---|---|---|---|
| 2,999,816 | 9/1961 | Bennett et al. | 252/67 |
| 2,999,817 | 9/1961 | Bower | 252/172 |
| 3,573,213 | 3/1971 | Burt | 252/172 |
| 3,728,269 | 4/1973 | Burt | 252/170 |
| 3,789,006 | 1/1974 | McMillan et al. | 252/171 |
| 3,903,009 | 9/1975 | Bauer et al. | 252/171 |

*Primary Examiner*—Robert Wax
*Attorney, Agent, or Firm*—James E. Shipley

[57] ABSTRACT

Azeotropic mixtures of 1,1,2-trichloro-1,2,2-trifluoroethane (FC-113) and 1,2-dichloro-1,1-difluoroethane (FC-132b) with methanol or ethanol, the azeotropic mixtures being useful in solvent cleaning applications.

10 Claims, No Drawings ated part of the 20
rosin, the flux and flux residues are often removed from
the board with an organic solvent. The requirements of
such a solvent are stringent: a solvent should have a low
boiling point, be non-flammable, have low toxicity, and
exhibit high solvent power so that flux and flux residues
can be removed without damage to the substrate being
cleaned.

AZEOTROPIC COMPOSITIONS OF TRICHLOROTRIFLUOROETHANE, DICHLORODIFLUOROETHANE AND METHANOL/ETHANOL

BACKGROUND OF THE INVENTION

As modern electronic circuit boards evolve toward increased circuit and component densities, thorough cleaning of the boards after soldering becomes more important. Current industrial processes for soldering electronic components to circuit boards involve coating the entire circuit side of the board with a flux and thereafter passing this coated side of the board over preheaters and through molten solder. The flux cleans the conductive metal parts and promotes adhesion of the solder. Commonly used fluxes consist, for the most part, of rosin used alone or with activating additives such as amine hydrochlorides or oxalic acid derivatives.

After soldering, which thermally degrades part of the rosin, the flux and flux residues are often removed from the board with an organic solvent. The requirements of such a solvent are stringent: a solvent should have a low boiling point, be non-flammable, have low toxicity, and exhibit high solvent power so that flux and flux residues can be removed without damage to the substrate being cleaned.

While boiling, flammability, and solvent power characteristics can often be adjusted by preparing mixtures of solvents, these mixtures are often unsatisfactory because they fractionate to an undesirable degree during use. Such mixtures also fractionate during recovery, making it difficult to reuse a solvent mixture with the original composition.

On the other hand, azeotropic mixtures, with their constant boiling and constant composition characteristics, have been found to very useful. Azeotropic mixtures exhibit either a maximum or minimum boiling point and do not fractionate upon boiling. These characteristics are also important in the use of the solvent compositions to remove solder fluxes and flux residues from printed circuit boards. Preferential evaporation of the more volatile components of the solvent mixtures, which would be the case if they were not azeotropes, or azeotrope-like, would result in mixtures with changed compositions which may have less desirable properties, such as lower solvency for rosin fluxes, less inertness toward the electrical components and increased flammability. This is also desirable in vapor degreasing operations where redistilled material is usually used for final rinse-cleaning. Thus, the vapor defluxing or degreasing system acts as a still. Unless the solvent composition exhibits a constant boiling point, i.e. is an azeotrope or is azeotrope-like, fractionation will occur and undesirable solvent distribution may act to upset the safety and effectiveness of the cleaning operation.

A number of fluorocarbon based azeotropic compositions have been discovered and in some cases used as solvents for the removal of solder fluxes and flux residues from printed circuit boards and for miscellaneous vapor degreasing applications. For example, U.S. Pat. No. 2,999,815 discloses the azeotrope of 1,1,2-trichloro-1,2,2-trifluoroethane with acetone; U.S. Pat. No. 3,903,009 discloses a ternary azeotrope of 1,1,2-trichloro-1,2,2-trifluoroethane with nitromethane and ethanol; U.S. Pat. No. 3,573,213 discloses an azeotrope of 1,1,2-trichloro-1,2,2-trifluoroethane with nitromethane; U.S. Pat. No. 3,789,006 discloses the ternary azeotrope of 1,1,2-trichloro-1,2,2-trifluoroethane with nitromethane and isopropanol; U.S. Pat. No. 3,728,268 discloses the ternary azeotrope of 1,1,2-trichloro-1,2,2-trifluoroethane with acetone and ethanol; and U.S. Pat. No. 2,999,817 discloses the binary azeotrope of 1,1,2-trichloro-1,2,2-trifluoroethane and methylene chloride.

Unfortunately, as recognized in the art, it is not possible to predict the formation of azeotropes and this obviously complicates the search for new azeotropic systems which have application in this field. Nevertheless, there is a constant effort in the art to discover new azeotropes or azeotrope-like systems which have desirable solvency characteristics and particularly a greater versatility of solvency power.

SUMMARY OF THE INVENTION

According to the present invention, an azeotrope or azeotrope-like composition has been discovered comprising an admixture of effective amounts of 1,1,2-trichloro-1,2,2-trifluoroethane, 1,2-dichloro-1,1-difluoroethane and an alcohol selected from the group consisting of methanol and ethanol and, more specifically, an admixture of about 67–81 weight percent 1,1,2-trichloro-1,2,2-trifluoroethane, about 15–26 weight percent 1,2-dichloro-1,1-difluoroethane and about 3–7 weight percent methanol or about 59–66 weight percent 1,2,2-trichloro-1,2,2-trifluoroethane, about 31–39 weight percent 1,2-dichloro-1,1-difluoroethane and about 2–4 weight percent ethanol.

The present invention provides nonflammable azeotropic compositions which are well suited for solvent cleaning applications.

DETAILED DESCRIPTION OF THE INVENTION

The compositions of the instant invention comprise admixtures of effective amounts of 1,1,2-trichloro-1,2,2-trifluoroethane ($CCl_2FCClF_2$, boiling point 47.6° C.) and 1,2-dichloro-1,1-difluoroethane ($CClF_2CH_2Cl$, b.p. 46.4° C.), with an alcohol selected from the group consisting of methanol and ethanol to form an azeotrope or azeotrope-like mixture. The two fluorinated materials are known as FC-113 and FC-132b, respectively, in the nomenclature conventional to the chlorofluorocarbon field.

By azeotrope or azeotrope-like is meant constant boiling liquid admixtures of two or more substances which admixtures behave like a single substance in that the vapor produced by partial evaporation or distillation has the same composition as does the liquid, i.e., the admixtures distill without a substantial change in composition. Constant boiling compositions characterized as azeotropes or azeotrope-like exhibit either a maximum or minimum boiling point as compared with that of nonazeotropic mixtures of the same substances.

By effective amount is meant the amount of each component of the admixture of the instant invention, which, when combined, results in the formation of the azeotrope or azeotrope-like admixture of the instant invention.

It is possible to fingerprint, in effect, a constant boiling admixture, which may appear under varying guises depending on the conditions chosen, by any of several criteria:

The composition can be defined as an azeotrope of A and B, since the very term "azeotrope" is at once both definitive and limitative, requiring that effective amounts of A and B form this unique composition of matter which is a constant boiling admixture.

It is well known by those who are skilled in the art that at differing pressures, the composition of a given azeotrope will vary, at least to some degree, and changes in distillation pressures also change, at least to some degree, the distillation temperatures. Thus, an azeotrope of A and B represents a unique type of relationship but with a variable composition depending upon temperature and/or pressure. Therefore, compositional ranges, rather than fixed compositions, are often used to define azeotropes.

Or, the composition can be defined as a particular weight percent relationship or mole percent relationship of A and B, while recognizing that such specific values point out only one particular such relationship and that in actuality a series of such relationships represented by A and B actually exist for a given azeotrope, varied by influence of distillative conditions of temperature and pressure.

Or, recognizing that the azeotrope A and B does represent just such a series of relationships, the azeotropic series represented by A and B can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Ternary mixtures of 59–66 weight percent FC-113, 2–4 weight percent ethanol and 31 to 39 weight percent FC-132b are characterized as azeotropes or azeotrope-like in that mixtures within this range exhibit a substantially constant boiling point. Being substantially constant boiling, the mixtures do not tend to fractionate to any great extent upon evaporation. After evaporation, only a small difference exists between the composition of the vapor and the composition of the initial liquid phase. This difference is so small that the compositions of the vapor and liquid phases are considered substantially identical. Accordingly, any mixture within this range exhibits properties which are characteristic of a true ternary azeotrope. The ternary composition consisting of about 62.4 weight percent FC-113, 2.7 weight percent ethanol, and 34.9 weight percent FC-132b has been established, within the accuracy of the fractional distillation method, as a true ternary azeotrope, boiling at about 43.2° C. at substantially atmospheric pressure and is the preferred azeotrope of this invention.

Also, according to the instant invention, ternary mixtures of 67 to 81 weight percent FC-113, 3 to 7 weight percent methanol and 15 to 26 weight percent FC-132b are characterized as an azeotrope or azeotrope-like in that mixtures within this range exhibit a substantially constant boiling point. Being substantially constant boiling, the mixtures do not tend to fractionate to any great extent upon evaporation. After evaporation, only a small difference exists between the composition of the vapor and the composition of the initial liquid phase. This difference is so small that the compositions of the vapor and liquid phases are considered substantially identical. Accordingly, any mixture within this range exhibits properties which are characteristic of a true ternary azeotrope. The ternary composition consisting of about 74.1 weight percent FC-113, 5.2 Weight percent methanol, and 20.7 weight percent FC-132b has been established, within the accuracy of the fractional distillation method, as a true ternary azeotrope, boiling at about 39.3° C. at substantially atmospheric pressure and is the more preferred azeotrope of this invention.

The azeotrope of the present invention permits easy recovery and reuse of the solvent from vapor defluxing and degreasing operations because of its azeotropic nature. As an example, the azeotropic mixture of this invention can be used in cleaning processes such as is described in U.S. Pat. No. 3,881,949, which is incorporated herein by reference.

The azeotropes of the instant invention can be prepared by any convenient method including mixing or combining the desired amounts of the components. A preferred method is to weigh the desired amounts of each component and thereafter combine them in an appropriate container.

EXAMPLE 1

The following compositions were prepared initially:
(a) FC-113/Methanol/FC-132b - 72.9/5.9/21.2 wt. percent
(b) FC-113/Ethanol/FC-132b - 60.9/2.9/36.2 wt. percent Each mixture was distilled in a Perkin-Elmer Model 251 Autoannular (spinning band) Still with a 200 plate fractionating capability using a 10/1 reflux/takeoff ratio. The results of these data are shown in the following table. The head temperatures were corrected to 760 mm Hg pressure. The compositions were determined by gas chromatography.

TABLE 1

Distillation of FC-113/Methanol/FC-132b

| Distillation Cut | Weight % Distilled or Recovered | Head Temp (°C.) | Composition (wt. %) | | |
|---|---|---|---|---|---|
| | | | FC-113 | Methanol | FC-132b |
| foreshot | 5 | 39.27 | 74.5 | 5.1 | 20.4 |
| 1 | 12 | 39.31 | 74.4 | 5.1 | 20.5 |
| 2 | 31 | 39.32 | 74.3 | 5.2 | 20.5 |
| 3 | 57 | 39.33 | 74.1 | 5.3 | 20.6 |
| 4 | 80 | 39.33 | 73.9 | 5.3 | 20.8 |
| 5 | 95.5 | 39.34 | 73.5 | 5.3 | 21.2 |
| heel | 98.3 | — | 18.6 | 42.2 | 39.2 |

TABLE 2

Distillation of FC-113/Ethanol/FC-132b

| Distillation Cut | Weight % Distilled or Recovered | Head Temp (°C.) | Composition (wt. %) | | |
|---|---|---|---|---|---|
| | | | FC-113 | Ethanol | FC-132b |
| foreshot | 6 | 43.15 | 62.5 | 2.8 | 34.7 |
| 1 | 29 | 43.16 | 62.5 | 2.7 | 34.8 |
| 2 | 50 | 43.17 | 62.5 | 2.7 | 34.8 |
| 3 | 69 | 43.21 | 62.4 | 2.7 | 34.9 |
| 4 | 88 | 43.20 | 62.1 | 2.7 | 35.2 |
| 5 | 93.4 | 43.20 | 62.1 | 2.7 | 35.2 |
| heel | 98.2 | — | 29.8 | 7.2 | 63.0 |

From the data in Tables 1 and 2, the azeotrope mean composition weight percentage ranges (± the 99.9% confidence limits*) and the boiling points were calculated as:

| | Composition No. | |
|---|---|---|
| | 1 | 2 |
| FC-113 (Wt. %) | 74.1 ± 2.3 | 62.4 ± 1.2 |
| FC-132b (Wt. %) | 20.7 ± 1.8 | 34.9 ± 1.4 |
| Methanol (Wt. %) | 5.2 ± 0.6 | |
| Ethanol (Wt. %) | | 2.7 ± 0.3 |

-continued

| | Composition No. | |
|---|---|---|
| | 1 | 2 |
| Boiling Point (°C., 760 mm Hg) | 39.32 ± 0.16 | 43.18 ± 0.16 |

*Note: The mean experimental azeotrope weight percentages for each component are the mean values of the compositions found in the foreshot and the five distillation cuts. For each component, the standard deviation of the six values was calculated. Each standard deviation was multiplied by a t-value of 6.859 (statistical term) to give the range in which there is a 99.9% probability of finding the true value for the azeotrope. The resulting statistical range based on experimental data for the true azeotrope was multiplied by three in order to establish a broader range over which the admixture is expected to exhibit azeotrope-like characteristics.

The following procedures are representative of cleaning operations to which the present azeotropic mixtures are applicable.

EXAMPLE 2

A single sided circuit board was coated with activated rosin flux and soldered by passing the board over a preheater to obtain a top side board temperature of approximately 200° F. and then through 500° F. molten solder. The soldered board was defluxed in an azeotropic mixture of 72.9 weight percent FC-113, 5.9 weight percent methanol and 21.2 weight percent FC-132b by suspending it, first, for three minutes in the boiling sump, then, one minute in the rinse sump, and, thereafter, for one minute in the solvent vapor above the boiling sump. The board thus cleaned had no visible residue remaining on it.

We claim:

1. An azeotrope or azeotrope-like composition comprising about 67-81 weight percent 1,1,2-trichloro-1,2,2-trifluoroethane and 15-26 weight percent 1,2-dichloro-1,1difluoroethane and about 3-7 weight percent methanol.

2. An azeotrope or azeotrope-like composition comprising about 59-66 weight percent 1,1,2-trichloro-1,2,2-trifluoroethane and 31-39 weight percent 1,2-dichloro-1,1-difluoroethane and about 2-4 weight percent ethanol.

3. The azeotrope or azeotrope-like composition of claim 1 wherein the composition is about 74.1 weight percent 1,1,2-trichloro-1,2,2-trifluoroethane, 20.7 weight percent 1,2-dichloro-1,1-difluoroethane and about 5.2 weight percent methanol.

4. The azeotrope or azeotrope-like composition of claim 1 wherein the composition has a boiling point of about 39.32° C. at substantially atmospheric pressure.

5. The azeotrope or azeotrope-like composition of claim 2 wherein the composition is about 62.4 weight percent 1,1,2-trichloro-1,2,2-trifluoroethane, 34.9 weight percent 1,2-dichloro-1,1-difluoroethane and about 2.7 weight percent ethanol.

6. The azeotrope or azeotrope-like composition of claim 2 wherein the composition has a boiling point of about 43.18° C. at substantially atmospheric pressure.

7. A process for cleaning a solid surface which comprises treating said surface with the azeotrope or azeotrope-like composition of claim 1.

8. The process of claim 7 wherein the solid surface is a printed circuit board contaiminated with flux and flux residues.

9. A process for cleaning a solid surface which comprises treating said surface with the azeotrope or azeotrope-like composition of claim 2.

10. The process of claim 9 wherein the solid surface is a printed circuit board contaminated with flux and flux residues.

* * * * *